United States Patent [19]

Chang

[11] 4,142,117
[45] Feb. 27, 1979

[54] VOLTAGE SENSITIVE SUPERCHARGER FOR A SAMPLE AND HOLD INTEGRATED CIRCUIT

[75] Inventor: James J. S. Chang, San Jose, Calif.

[73] Assignee: Precision Monolithics, Inc., Santa Clara, Calif.

[21] Appl. No.: 786,196

[22] Filed: Apr. 11, 1977

[51] Int. Cl.$^2$ .............................................. G11C 27/02
[52] U.S. Cl. .................................. 307/353; 307/246; 307/294; 328/151
[58] Field of Search ............... 307/351, 352, 353, 246, 307/293, 294; 328/151, 185, 183, 147, 149

[56] References Cited

U.S. PATENT DOCUMENTS 3,862,437  1/1975  Rossell .................................. 307/351

Primary Examiner—John Zazworsky
Attorney, Agent, or Firm—Poms, Smith, Lande, Glenny & Rose

[57] ABSTRACT

An integrated circuit for rapidly charging a capacitive holding device to a voltage level within a predetermined range of acquired samples. One or more supercharging circuits can be provided to supplement the input signal in charging the signal holding device when the input signal by itself is not capable of providing enough current for rapid operation. The supercharging circuits compare the input signal with the held signal and provide supplemental charging current when the differential between these signals exceeds a predetermined threshold amount. Above this threshold the supplemental charging current varies progressively and preferably linearly with the signal differential, until a terminal point is reached above which the supercharging current remains constant. Provision is also made for inhibiting leakage of the held signal back into the charging circuit.

20 Claims, 11 Drawing Figures

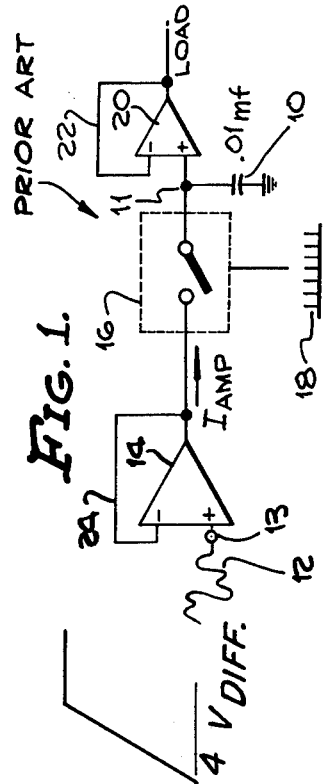
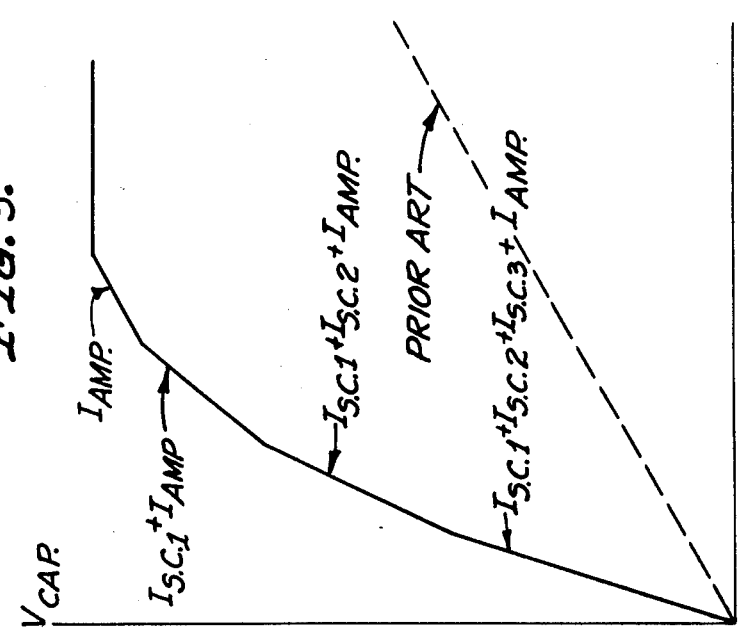
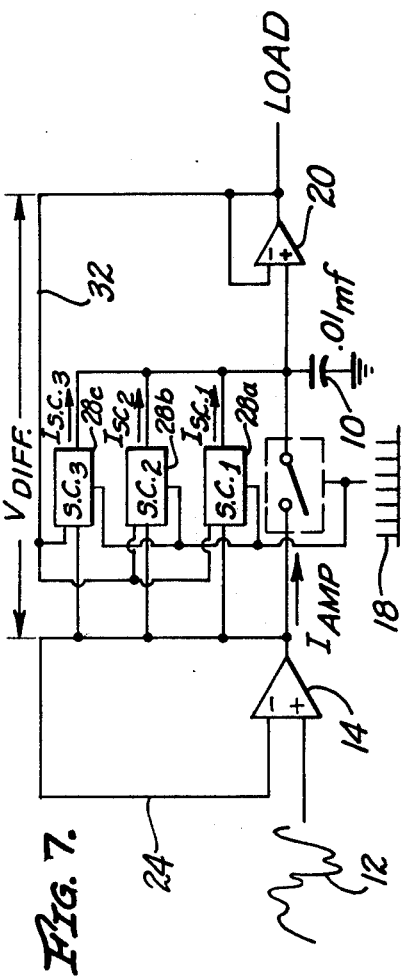
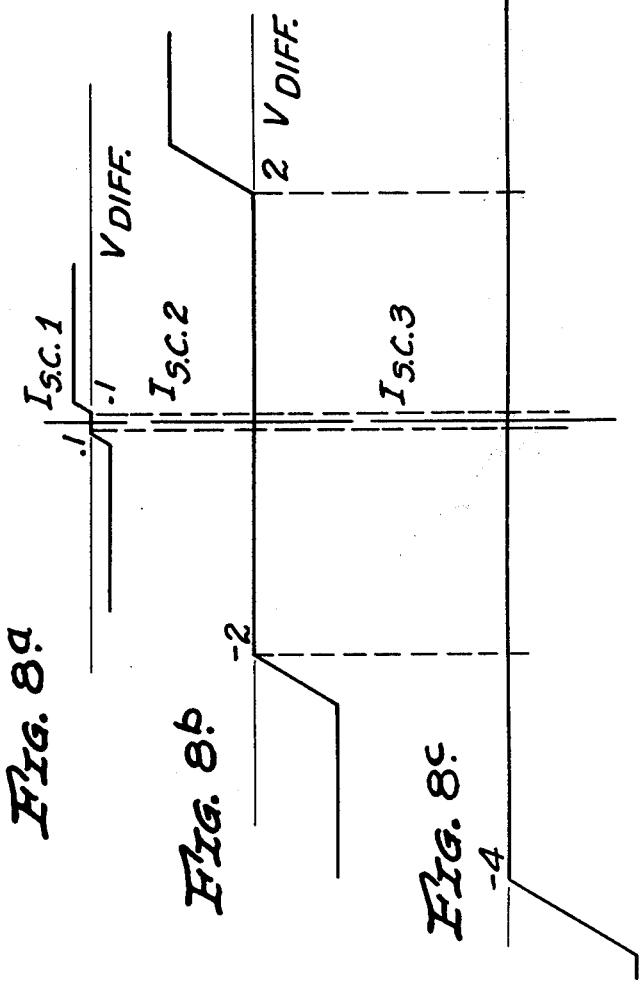

VOLTAGE SENSITIVE SUPERCHARGER FOR A SAMPLE AND HOLD INTEGRATED CIRCUIT

BACKGROUND OF THE INVENTION

This invention relates to integrated circuitry, and more specifically to an integrated circuit for use in a sample and hold network.

Sample and hold circuits have been found to be very useful in processing a number of different signals through a single item of equipment. Rather than transmitting each signal in its entirety, it is possible to acquire discrete time-spaced samples of the various signals, process the samples instead of the original signals, and then reconstitute the samples back into their original form when the processing is complete. Very high degrees of accuracy can be achieved if samples are taken at a sufficient frequency. For example, numerous telephone conversations can be transmitted over a single telephone line by the process of multiplexing, i.e., acquiring samples of each conversation sequentially, converting the signals to digital code, transmitting the coded signals in series over the line, and then demultiplexing by segregating and decoding the signal for each separate conversation at the other end of the line so that the various conversations may be reconstructed through filter network in their original form. By a proper synchronization of the multiplexing equipment at the transmitting end with the demultiplexing equipment at the receiving end, the transmission line can be efficiently utilized to transmit all of the conversations over the same time span.

Since there is a minimum sampling rate (known as the Nyquist rate) necessary to attain a given level of transmission accuracy for each conversation, the number of conversations that can be handled depends to a considerable degree on the number of different conversation samples that can be sandwiched in between successive samples of the first conversation. This in turn depends upon the brevity of each sample or, in other words, the amount of time necessary to acquire each sample. In addition, rapid signal acquisition enhances synchronization between the sampling and signal reconstituting functions. The capacity and efficiency of a telephonic transmission system is accordingly directly related to the speed at which samples can be acquired.

A capacitor is commonly used to hold each sample for data conversion until the next sample is to be acquired. During the new sample acquiring period the capacitor is charged to adjust its voltage level to that of the new sample. (The term "charging" as used herein includes both positive and negative charging, unless otherwise indicated by the text.) A simple way of accomplishing this involves connecting the input signal to the capacitor through a switch. The switch is operated by a series of control pulses so as to close the connection between the input signal and capacitor during sample acquisition periods, and open the connection during hold periods. While this technique is capable of producing the correct sample levels, the time required to charge the capacitor for each sample is dependent upon the current available from the input signal, which frequently is current limited and unduly increases the total time spent in the sampling mode. In order to alleviate this problem a current amplifier may be introduced between the input signal and the capacitor to increase the charging rate and thereby reduce the time required for each sample. However, beyond a certain degree of current amplification this becomes relatively expensive for integrated circuitry. Higher gains can also result in an overshooting of the desired capacitor charge that necessitates a delay to allow the capacitor to recover the correct voltage level. Another problem associated with integrated circuitry involves the junction reverse bias currents of the large geometry power transistors. These currents cause an undesirable droop of the capacitor signal during hold mode.

SUMMARY OF THE INVENTION

In view of the above problems associated with the prior art, it is an object of this invention to provide a novel and improved integrated circuit capable of rapidly charging a capacitor to within a predetermined range of the full value of a sampled signal.

Another object is the provision of such a novel and improved integrated circuit in which a capacitor can be charged rapidly, and yet overcharging is avoided by producing a charging current which varies proportionately and preferably linearly with the charge deficiency on the capacitor, within specified ranges of that deficiency.

Still another object is the provision of an integrated circuit as described above which is relatively inexpensive to produce.

Another object is the provision of an integrated circuit in which charge leakage from associated power transistors is significantly reduced.

In the accomplishment of these and other objects of the invention, a voltage sensitive supercharger is provided for sequentially sensing an input signal, and rapidly charging a sample holding means to a level close to that of each successive sample. The supercharger compares the input signal with the signal at the holding means, and provides a supplemental charging signal when the differential between the compared signals exceeds a predetermined threshold level.

In order to enhance its charging capability, the voltage sensitive supercharger is designed to produce a supplemental charging signal which is characterized by an essentially zero magnitude when the differential between the compared signals is less than the threshold level, a progressively increasing magnitude, preferably at a linear rate, as the signal differential progressively exceeds the threshold level, and a substantially constant magnitude when the signal differential exceeds a predetermined terminal level. Additional superchargers may also be employed, each having current response similar to that of the first supercharger but with different threshold levels, charging rates, and terminal levels.

An integrated circuit for producing the desired current response comprises a differential stage having first and second branches connected to divide a tail current from a current source, the proportion of current going through each branch being determined by the differential between gating signals applied to the branches and a second current driver stage which amplifies the differential stage output current by a predetermined amplification factor. Circuitry is provided to ensure that the gating signal differential is in turn indicative of the differential between the compared voltages. Two constant current drains are connected respectively to the first and second branches of the differential stage to drain substantially constant amounts of actuating current from entering the second stage. The relationship governing the division of current between the two branches relative to the differential between their respective gating signals, the relationship governing the differential between the said gating signals relative to the differential between the compared voltages, and the operating levels of the current drains are all selected to produce a current output from the second stage having the desired characteristics.

In a preferred embodiment the current drains are connected to the opposite sides of their respective differential stage branches from the tail current source and in series therewith, while the differential stage divides current substantially equally between its two branches when the gating signals applied to the branches indicate a zero differential between the sensed voltages. The operating levels of the two drains are mutually equal and greater than the current passed through either branch when the differential between the sensed voltages is less than the desired threshold level; the current drains thereby divert actuating current from entering the second stage and inhibit actuation thereof until the differential between the sensed voltages exceeds the threshold level.

In another feature of the preferred embodiment, the second stage comprises first and second current drivers actuated by actuating currents from the first and second differential stage branches, respectively. The current drivers are of opposite polarities such that, when actuated, one delivers current to and the other draws current away from the supercharger output. Actuating current is provided to one of the current drivers for a positive differential between the sensed voltages and to the other current driver for a negative voltage differential, the differential stage, current drivers, and current drains all being selected such that substantially symmetrical output current waveforms of opposite polarities are produced by the current drivers.

The invention further improves the performance of a sample and charging integrated circuit by reducing most of the transistor leakage current that would ordinarily flow from or into the holding capacitor during the hold mode. This is accomplished by interposing transistor devices between the capacitor terminal and each current driver, the relatively small junction area of each device being connected to the terminal, and by clamping the voltages between each device and their respective current drivers at equal but opposite differentials from the capacitor voltage. Mutually cancelling reverse bias currents are thereby established through the low leakage transistor devices, while the high leakage current drivers are effectively decoupled from the capacitor during the hold mode.

DESCRIPTION OF THE DRAWINGS

Further advantages and features of the invention will be apparent to those skilled in the art from the ensuing detailed description thereof, taken together with the accompanying drawings, in which:

FIG. 1 is a block diagram of a prior art sample and hold circuit;

FIG. 7 is a block diagram of another embodiment of the invention, in which a plurality of supercharger circuits are employed;

FIGS. 8a, 8b and 8c are current response graphs similar to FIG. 3 for each of the superchargers shown in FIG. 7; and FIG. 9 is a graph similar to FIG. 4 illustrating the buildup of charge on the holding capacitor achieved by the configuration of FIG. 7 as compared to the prior art.

DETAILED DESCRIPTION OF PREFERRED EMBODIMENTS

Figure 2:
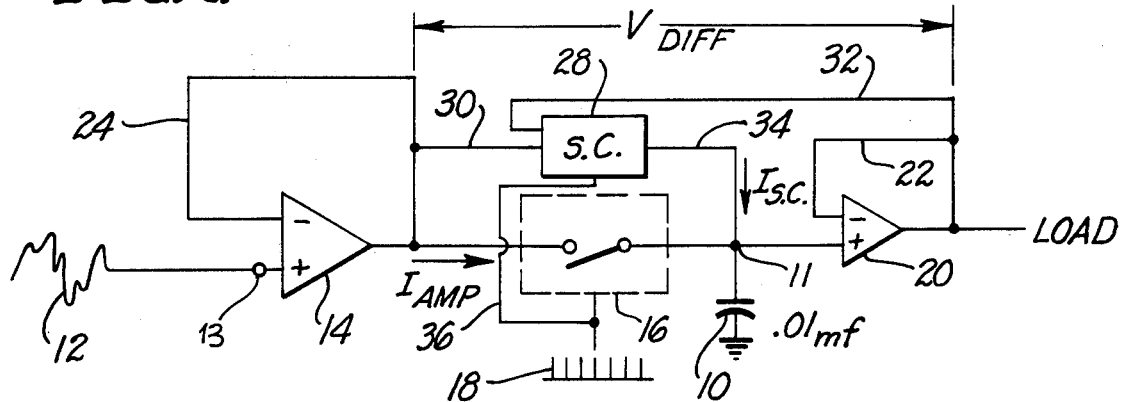
FIG. 2 is a block diagram of a sample and hold circuit incorporating the present invention.

Referring first to FIG. 1, there is shown an overall block diagram of a prior art sample and hold integrated circuit used to charge a sample holding capacitor 10, connected to the circuit at an output terminal means 11. An input signal 12, represented in the figure by a varying voltage symbol, is delivered to an input terminal 13 at the positive input of a unity gain buffer amplifier 14, which amplifier presents a high input impedance to the signal. The output of amplifier 14 is delivered to a switch 16, and from there to the capacitor 10. A logic signal comprising a series of narrow pulses 18 controls switch 16, causing it to close for the duration of each pulse and to open at other times. In this manner a signal at the output of amplifier 14, represented in the figure by $I_{AMP}$, is presented to capacitor 10 only for the duration of each pulse 18. The capacitor is charged to the sampled value of the input signal while the switch is closed, and holds this holding signal after the switch opens until the switch again closes at the next control pulse.

Capacitor 10 is also connected to the positive input of a second unity gain buffer amplifier 20 which has a high input impedance to prevent leakage from the capacitor during the hold mode, and a low output impedance to enhance driving of a load such as an analog to digital converter. The output of amplifier 20 is connected in a feedback loop over line 22 back to its negative input.

The sample and hold circuit described thus far is fairly conventional. Prior art devices, however, particularly those which utilize integrated circuitry, are limited in the speed at which the holding capacitor can be charged. For relatively large voltage differentials between successive sample signals, the described circuitry may require a relatively long sample acquisition time in which to bring the capacitor to the proper signal level. This in turn can produce a requirement for control pulse widths of greater duration than would otherwise be necessary, and thus reduce the efficiency of the system. Problems in synchronizing related data conversion devices can also result from increased sampling times. These problems may be alleviated by increasing the output of input amplifier 14, but this would be quite expensive for integrated circuits.

Now, referring to FIG. 2, the problems associated with an insufficient charging rate are overcome in the present invention by the addition of a supercharger circuit 28 to provide additional charging current when needed (elements common to both FIGS. 1 and 2 are identified by the same reference numerals). It is an important feature of the invention that this additional current is in an amount proportional to the deficiency of charging current from amplifier 14. Broadly speaking, supercharger 28 is connected to the output terminal of amplifier 14 by line 30 and to the output of amplifier 20 by line 32 in order to detect any difference in voltage between these two points. This difference in turn gives the voltage differential between the input signal 12 and the signal on capacitor 10, which signals are respectively transmitted through unity gain amplifiers 14 and 20. When the measured voltage differential exceeds a predetermined amount a supplemental charging current indicated by $I_{S.C.}$ in the figure, is delivered to capacitor 10 over line 34 to increase its charging rate. Supercharger 28 is connected to control logic signal 18 by line 36 and is operated only during successive sampling pulses.

Figure 3:
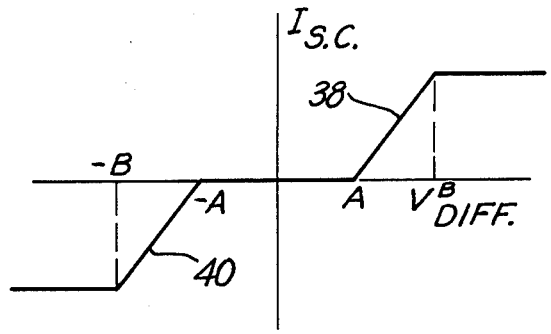
FIG. 3 is a graph illustrating the current response of the voltage sensing supercharger circuit of FIG. 2 to the voltage differential sensed by the supercharger.

Referring now to FIG. 3, the current output response of the supercharger relative to the sensed voltage differential is illustrated, the charging current being plotted on the vertical axis and the voltage differential between input terminal 13 and output terminal 11 on the horizontal axis. It can be seen that zero supplemental charging current is produced when the absolute value of the voltage differential is less than a threshold level A. The supercharger circuit is designed such that threshold level A is a predetermined amount, typically in the order of 100 millivolts for most single supercharger applications. As the voltage differential exceeds the threshold level in a positive direction, i.e., the voltage at input terminal 13 becomes increasingly greater than the voltage at output terminal 11, positive charging current begins to flow from the supercharger to the capacitor. While it is possible for this current to increase in steps with increasing voltage differential, it has been found that better capacitor charging is obtained when the supercharging current increases progressively with increases in the voltage differential. As will be seen hereinafter in the discussion relating to FIG. 5, supercharger 28 employs lateral PNP transistors. These transistors are characterized by relatively long turn-off times, and can result in overcharging the capacitor if the supercharging current does not steadily decrease as the voltage differential decreases. Preferably, this current varies linearly with the voltage differential along a ramp 38. With the preferred supercharger circuitry described hereinafter, a terminal point is reached at a voltage differential B beyond which the supplemental charging current remains substantially constant for increases in the voltage differential. In many cases a terminal supplemental charging current in the order of 50 milliamps will produce a sample acquisition time of less than 10 microseconds for a 10 volt differential signal to a 0.01 microfarad hold capacitor.

The supercharger current waveform is symmetrical about the origin so that a supplemental discharging current is applied to the capacitor when the input voltage at terminal 13 is less than the capacitor voltage at terminal 11. As in the case of positive supplement charging current, zero current is produced by the supercharger until the negative voltage differential exceeds −A. Thereafter a transition range is entered and the discharging current steadily increases with the voltage differential along ramp 40 until a terminal point is reached at −B.

The provision of a zero supplemental current level, or "deadband", between voltage differentials A and −A is an important feature of the invention. In the deadband range the only current going to the capacitor is the usual relatively low level charging current processed through amplifier 14. If the deadband was eliminated and supplemental charging current provided for all voltage differentials, the cumulative effect of the usual and supplemental charging currents may be enough to overshoot the desired signal level on the capacitor. As a result either an incorrect capacitor signal would be obtained, additional time would have to be expended to allow the capacitor to return to the desired voltage level, or the whole system is unstable. By selecting a deadband wide enough for the normal charging current to perform its function rapidly during its confines, the amount of time necessary to acquire a sample is not significantly increased and the overshoot problem is avoided.

Figure 4:
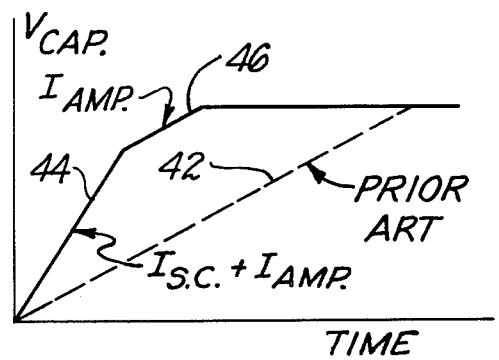
FIG. 4 is a graph illustrating the buildup of charge on the holding capacitor with the present invention as compared to the voltage buildup achieved in the prior art.

FIG. 4 represents the charging of holding capacitor 10 over time. While the graph employs straight line segments for simplicity, it should be understood that, due both to the steadily decreasing voltage differential between the output of amplifier 14 and output terminal 11, and to ramps 38 and 40 in the supercharger waveform, the voltage on the capacitor would normally follow a curved line when plotted against time. The charging rate achieved in the prior art without the use of a supercharger is indicated by dashed line 42, which charging rate is produced solely by the current provided by amplifier 14. Assuming the voltage differential initially exceeds the supercharger threshold level, the capacitor will initially receive both a normal charging current from amplifier 14 and a supplemental charging current from the supercharger, and its voltage will increase rapidly generally along line segment 44. The amount of supercharging current at any given time is determined by the relationship shown in FIG. 3. As the voltage differential decreases the supplemental charging current will also decrease, and ultimately fall to zero when the voltage differential drops to threshold level A. For the remainder of the active sampling period the capacitor will be charged only by the charging current passed through amplifier 14, and its voltage will increase generally parallel to line 42 along line segment 46. It can be seen that with the addition of the supercharger a considerably faster sample acquitiion is achieved. The acquisition time, of course, will depend upon the particular characteristics of the supercharging circuit.

Figure 5:
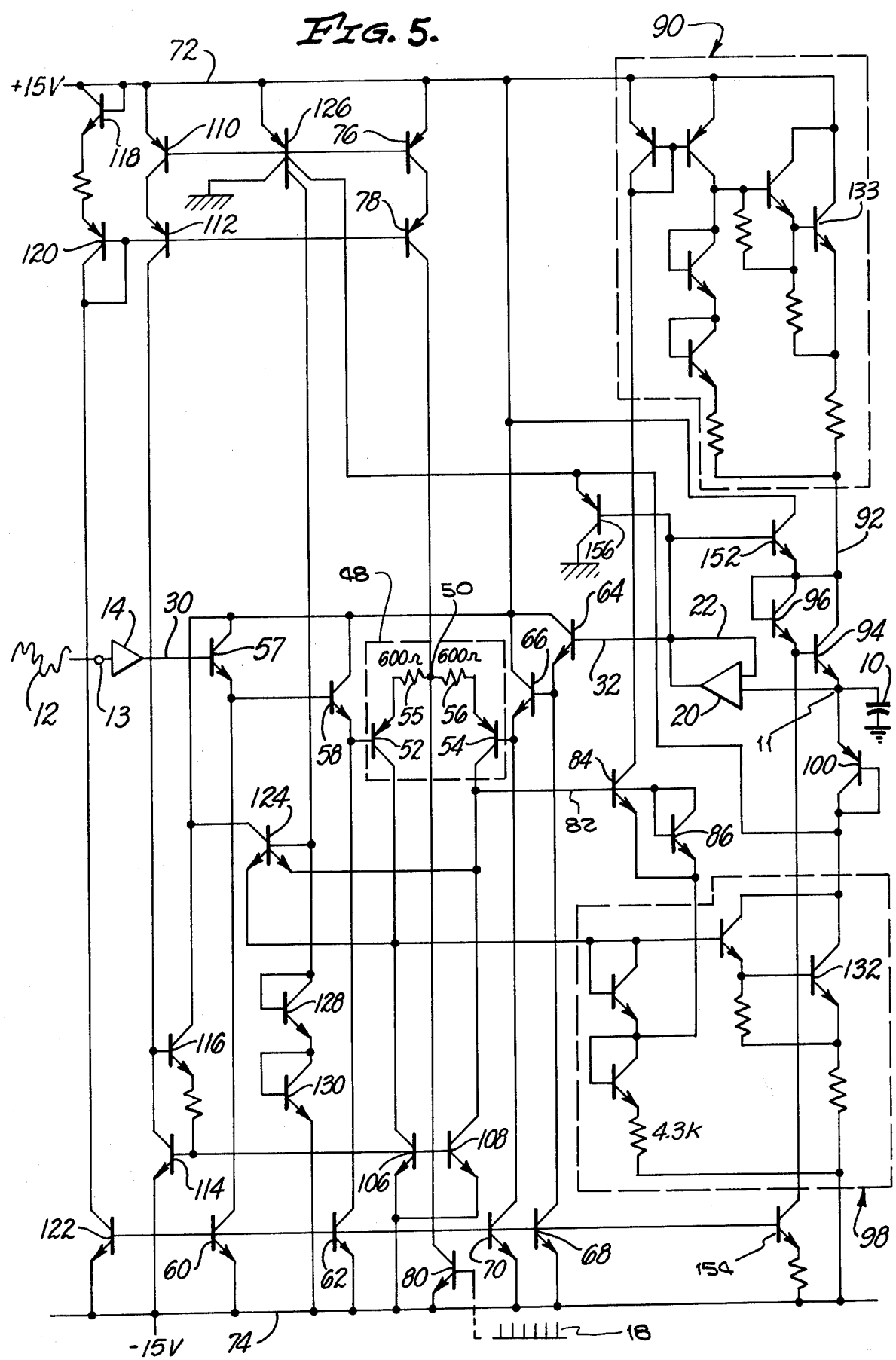
FIG. 5 is a circuit diagram of a preferred embodiment for the supercharger.

Referring now to FIG. 5 for a detailed description of a preferred embodiment of the voltage sensing supercharger circuittry, a comparison between the input and output voltages is achieved with the use of a differential stage 48, shown surrounded by a dashed line. This differential stage comprises a pair of branches connected together at node 50, the respective branches including matched transistors 52 and 54 connected to node 50 through intermediate resistors 55 and 56 and being of polarities to pass current away from the node.

A differential stage is a current dividing circuit in which incoming current is divided between two branches in logarithmic proportion to the difference in the gating or bias voltages applied to the base of each branch transistor. In the present circuit, if resistors 55 and 56 were eliminated, the current directed to one branch would exceed the current directed to the other branch by a factor of ten (10) for approximately every sixty (60) millivolts by which the first branch's gating voltage exceeds the gating voltage of the other branch. As will be explained in greater detail hereinafter, the provision of resistors 55 and 56 reduces this response close to a linear relationship.

A gating signal for transistor 52 is provided from input terminal 13 through amplifier 14, while a gating signal for transistor 54 indicative of the voltage at output terminal 11 is provided from the output of amplifier 20. Transistors 57, 58, 60 and 62 form an input buffer circuit for transistor 52 to reduce the input current to that transistor and thereby reduce any error that may otherwise have been introduced, while transistors 64, 66, 68 and 70 form a buffer circuit for transistor 54. Transistors 57, 58, 64 and 66 all have their collectors connected to a common positive power bus 72, with transistors 60, 62, 68 and 70 connected as current sources to the emitters of each of the above four transistors respectively. Transistor 57 has its base connected to the output of amplifier 14 for gating by input signal 12, and is connected to gate transistor 58 which in turn gates branch transistor 52. Similarly, transistor 64 has its base connected to be gated by the output of amplifier 20 in order to gate transistor 66, which in turn gates the other branch transistor 54. The bases of all the current source transistors 60, 62, 68 and 70 are connected together at a constant potential difference from a negative bias bus 74 whereby the bias on these last four transistors remains substantially constant and they function effectively as constant current sources. (In the ciruit diagram of FIG. 5, a connection between the bases of a plurality of transistors is indicated by a continuous line passing through each of the intermediate transistors and terminating at the end transistors; all other connections are indicated by a dot.)

Current is provided to the differential stage by cascoded current source transistors 76 and 78 connected in circuit between positive bus 72 and node 50 of the differential stage. The base of current source transistor 76 is maintained at a substantially constant level so that a current of about one milliamp is produced. This current is divided between transistors 52 and 54 according to the difference between their respective gating signals. In order to effectively decouple the supercharger from the remainder of the sample and hold circuit during the hold mode, transistor 80 is connected between node 50 and negative bus 74. This transistor, which also forms a part of a differential stage (not shown) used in the circuit for switch 16, is interconnected with the logic control signal such that it is switched off during the sample mode, but draws sixty percent (60%) of the current from transistor 78 during the hold mode. As will be described hereinafter, this is sufficient to prevent the supercharger from providing any charging or discharging current to the holding capacitor during the hold mode regardless of the magnitude of the input to the differential stage.

During sampling periods transistor 54 initiates capacitive charging currents, while transistor 52 initiates discharging currents which reduce the voltage on the capacitor. First tracing the path of charging currents, when a current flow of sufficient magnitude passes through transistor 54 a signal is produced on line 82 to bias a current level shifting circuit, comprising transistor 84 and diode 86, into conduction. (In integrated circuits diodes are normally formed by tying together the base and collector of a transistor; although the actual transistor is shown in FIG. 5, such devices will be referred to herein as diodes to indicate their function in the circuit.) This in turn actuates a current driver such as the current amplifier circuit enclosed in dotted lines and identified by reference numeral 90.

Current amplifier 90 produces an amplified current output over line 92 which, after passing through part of a leakage cancellation circuit comprising transistor 94 and diode 96, reaches output terminal 11 to charge capacitor 10.

Capacitive discharge currents are provided by a second current driver such as current amplifier 98, which receives and amplifies current from branch transistor 52 to discharge the capacitor. A diode 100, also part of the leakage cancellation circuit, is interposed between current amplifier 98 and the capacitor.

As mentioned above, a differential stage normally produces a logarithmic current shift for each of its branches in response to linear changes in the differential between the gating signals applied to each branch. In order to achieve the desired linear relationship between current and voltage difference, resistors 55 and 56 are inserted between node 50 and transistors 52 and 54 respectively. These resistors tend to retard an increase in the current flowing through either branch, and their resistance values are selected such that a linear voltage-current relationship is established for each branch up to a few volts of differential input.

In order to achieve the supercharger dead zone referred to above, transistors 106 and 108 are connected in series between negative bus 74 and transistors 52 and 54, respectively. A common biasing network supplies a constant bias voltage to each transistor 106 and 108, whereby they function as current sources to drain current emanating from the differential stage. These current drain transistors and their biasing circuits are designed such that each transistor drains off somewhat more than half the current supplied to the differential stage by current source 76. Assuming a one milliamp current for source 76, the drain for each transistor could be 600 microamps. Thus, when the current from source 76 is divided equally between transistors 52 and 54 (indicating a zero voltage differential between terminals 11 and 13), the current drained by transistors 106 and 108 exceeds the current flowing through each of their respective differential stage branches, thereby preventing any current from reaching amplifiers 90 and 98. This condition persists until the imbalance between the gating voltages for transistors 52 and 54 has reached a level at which the current through one of the branches exceeds the current drained by its associated drain transistor. Beyond this point actuating current is supplied to its associated current amplifier and, depending upon which branch of the differential stage is supporting the greater current flow, either charging or discharging current is supplied to the capacitor. The voltage differential between terminals 11 and 13 at which capacitor charging commences is the threshold level marking the limits of the deadband.

The bias circuit for transistors 106 and 108 includes transistors 110, cascoding transistor 112, and transistor 114, all connected in series between the positive and negative buses with their bases tied respectively to the bases of transistors 76, 78, and 106/108. This bias line is buffered by transistor 116, which has its collector-emitter circuit connected between positive bus 72 and the base of transistor 114, and its base connected between transistors 112 and 114. Another circuit comprising series connected diodes 118 and 120 and current source transistor 122 is connected between positive bus 72 and negative bus 74 to provide a constant bias voltage for cascoding transistor 112, and also for cascoding transistor 78. A multiemitter transistor 124 is provided with its emitters connected respectively to the collectors of transistors 106 and 108 to clamp the collector voltages at a level no less than six hundred (600) millivolts above negative bus 74, thereby preventing transistors 106 and 108 from deep saturation. Transistor 124 is biased by a network comprising one collector of a multicollector transistor 126 and a pair of series connected diodes 128 and 130, and has its collector tied to positive bus 72.

A further feature of the invention deals with the problem of leakage from holding capacitor 10 during the hold mode, resulting in a "droop" in the capacitive charge. This phenomenon can generally be attributed to three causes: (a) the input biasing current required by amplifier 20, (b) the characteristics of the holding capacitor itself, and (c) leakage back into the supercharger due to reverse bias leakage current across the junction between the substrate and epitaxial region of large area transistor 132 included in current amplifier 98 and the collector base reverse bias current of power transistor 133 in current amplifier 90. The last factor is generally the greatest contributor to capacitor leakage, and is substantially solved by the present invention.

Figure 6:
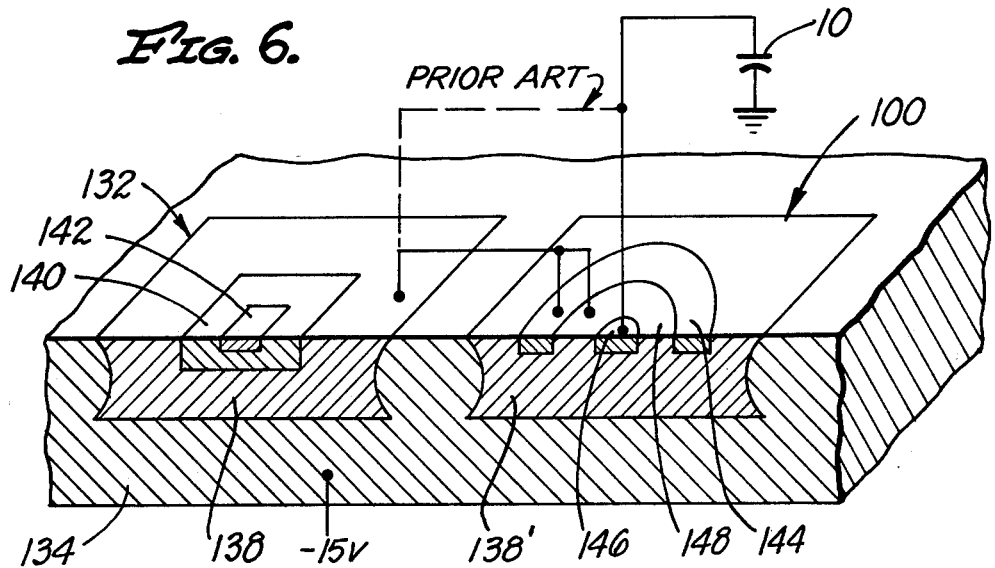
FIG. 6 is a cutaway view of one portion of the integrated circuit chip illustrating an arrangement for reducing reverse bias leakage current into the chip substrate.

A visualization of the problem of substrate epitaxial current is provided in FIG. 6. The portion of the integrated circuit chip upon which current amplifier transistor 132 and diode 100 are formed is shown in cross-section. The chip substrate 134 is formed from a P-type material. An N-type epitaxial layer 138 is then grown on the substrate to form the collector of transistor 132, followed by diffusion of a P-type base 140 and a heavily doped N-type emitter 142. With the substrate connected to the negative power supply bus, the substrate/epitaxial junction is always reverse biased isolating the transistors from each other. In the prior art holding capacitor 10 is typically tied directly to the epitaxial collector region 138, as indicated by a dashed line. Due to the relatively large junction area between the collector epitaxial region and the substrate, this arrangement resulted in a large reverse bias leakage current passing across that junction to discharge the capacitor. The present invention alleviates this leakage problem by interposing diode 100 between the capacitor and transistor 132. In the illustrative circuit depicted in FIG. 6, the collector and emitter of the transistor structure comprising diode 100 are formed from concentric P-type rings 144 and 146, separated by a ring-shaped portion of the diode epitaxial region 138' to form a base 148. The area of the diode emitter 146 is quite small compared to the area of the epitaxial collector 138 of transistor 132. The emitter of diode 100 will therefore pass much less reverse bias leakage current than will the collector of transistor 132. Furthermore, the base and collector of diode 100 are clamped at the potential which reverse biases the diode at a few hundred millivolts over the capacity voltage, and the diode reverse bias current thus greatly reduced and held constant over variations of the hold signal level.

Referring back to FIG. 5, the same technique is employed to decouple power transistor 133 from the capacitor during the hold mode. The base of transistor 94 is clamped at a few hundred millivolts below the capacitor voltage. The direction of leakage current for transistor 94 is therefore reversed, i.e., it flows out of rather than into the capacitor, and the magnitude is also greatly reduced compared to the collector-base reverse bias current of transistor 133.

A bias is provided for diode 100 and transistor 94 to hold the net capacitor reverse bias leakage essentially at zero. A constant current is provided by transistor 154 to NPN diode 96 and the collectors of transistors 94 and diode 96. Another constant current is provided by one of the collectors of multi-collector transistor 126 to transistor 156, diode 100, and transistor 132, the bases of transistors 156 and 152 being jointly connected to the output of amplifier 20. These circuits keep the voltage at the collector of diode 100 at a constant potential above the capacitor voltage, and the voltage at the base of transistor 94 at an equal potential difference below the capacitor voltage, the potential difference in each case preferably being about 0.6 volts. Reverse bias currents of equal magnitude are thereby set up through diode 100 and transistor 94. The current through diode 100 enters output terminal 11 and the current through transistor 94 leaves terminal 11, thereby preventing any appreciable amount of current from entering or leaving the capacitor during the hold mode.

The operation of voltage sensing supercharger 28 will now be reviewed. Assume initially that the voltage level at output terminal 11 is equal to the input signal voltage at input terminal 13. The bias voltages applied to differential stage transistors 52 and 54 will therefore be equal, causing the one milliamp current from transistor 78 to divide equally between the two branches, with 500 microamps going to each branch. Since transistors 106 and 108 each drain 600 microamps, no actuating current will be delivered to current amplifiers 90 and 98, and the supercharger will produce a zero output.

Now assume that the input voltage begins to rise with respect to the capacitor voltage. This will increase the bias voltage for transistor 52 and thereby reduce the amount of current passed through that PNP transistor. Since the current delivered from transistor 76 is constant, transistor 54 will carry a correspondingly greater amount of current, the magnitude of which will vary linearly with the voltage differential between terminals 11 and 13 due to the effect of resistors 55 and 56. Until the current through transistor 54 reaches the 600 microamp drain of transistor 108, however, no actuating current will be delivered to current amplifier 90 and the only charging current delivered to the capacitor will come through operational amplifier 14. This voltage differential range is referred to above as the dead zone. As the current through transistor 54 continues to increase and exceeds the 600 microamp threshold, a positive current will be delivered over line 82 to transistor 84, which shifts the current and delivers an actuating signal to current amplifier 90. A charging current will accordingly be produced by that current amplifier and directed through transistor 94 to the capacitor, the magnitude of the charging current increasing linearly with the sensed voltage differential in excess of the threshold voltage. The greater the voltage differential becomes, the more charging current will be delivered to the capacitor, producing a very rapid charging. If the voltage differential continues to increase, a terminal point will eventually be reached at which all of the current is sent through transistor 54 and none through transistor 52. At this point the supercharger output current is at a maximum, and greater voltage differentials will produce the same charging current level. When the voltage on the capacitor begins to approach that of the input signal and the voltage differential accordingly tapers off, the charging current will be reduced by a corresponding amount so that rapid charging continues but not so rapidly as to cause overshooting of the final desired capacitor voltage.

A similar result is achieved when the input voltage is less than the capacitor voltage and the capacitor must be discharged to reach the new voltage level. In this case the bias signal at transistor 52 will go down, increasing the current through that transistor until it exceeds the 600 microamp drain of transistor 106. Beyond this point actuating current is delivered to current amplifier 98, which will commence discharging the capacitor. When the desired capacitor signal level is reached the hold mode commences, during which time reverse bias leakage current to the substrate is substantially reduced by the action of diode 100, transistor 94, and their associated biasing networks. Rapid and efficient sampling and charging are thereby attained with very little increase in the cost or complexity of the integrated circuitry employed.

Another embodiment of the invention is illustrated in FIG. 7. In this figure the same reference numerals are used as in FIG. 2 for common elements. This embodiment provides even faster charging than the embodiment of FIG. 2, while still avoiding the danger of capacitive overshooting, by employing a plurality of parallel connected superchargers 28a, 28b and 28c. The construction of each supercharger is essentially similar to that of supercharger 28 described above, but the values of their internal elements are selected such that each supercharger produces a progressively larger charging current and is characterized by a progressively wider deadband. The voltage-current characteristics of superchargers 28a, 28b, and 28c are illustrated in FIGS. 8a, 8b, and 8c, respectively. Typical voltage threshold values are given in these figures, while typical maximum charging capacities might be 50 milliamps for supercharger 28a, 200 milliamps for 28b, and 500 milliamps for 28c. These magnitudes are of course arbitrary, and would depend upon the particular application.

FIG. 9 is similar in concept to FIG. 4, and illustrates the capacitor charging curve for this embodiment. Again, the curve is shown as a series of straight line segments for purposes of simplicity, but in reality it would follow more of a curved path. It can be seen that the charge on the capacitor increases much faster than would be the case for comparable prior art circuits without the use of superchargers. It should also be noted that, assuming the charging capability of at least some of the supercharger units is greater than that of the single supercharger shown in FIG. 2, the charging rate is greater than that shown in FIG. 4. However, the charging rate immediately before the final capacitor voltage is reached, when only operational amplifier 14 is providing charging current, is the same as in FIG. 4 and the prior art. Any significant overshoot problem is thereby avoided.

While various embodiments of the invention for achieving rapid and efficient charging of a signal holding capacitor in response to a variable input signal have been shown and described, numerous additional modifications and variations are possible in light of the above teachings. It is therefore intended that the scope of the invention be limited only in and by the terms of the appended claims.

What is claimed is:

1. An integrated circuit for sampling an input signal and charging a sample holding means to within a predetermined range indicative of each successive sample, said circuit comprising:

input terminal means for receiving an input signal and output terminal means for connection with a sampling holding means, circuit means connected between said input and output terminals for providing a first charging signal to said output terminal, the magnitude and polarity of said charging signal being determined by the input signal sample, and a supercharging means discrete from said circuit means, said supercharging means having means to compare the signal levels at said input and output terminals, and means to provide a supplemental charging signal to add to the first charging signal at said output terminal when the differential between said compared signals exceeds a predetermined threshold level.

2. The integrated circuit of claim 1, and further including means responsive to an applied control signal for coupling and uncoupling said circuit and supercharging means with respect to said output terminal to achieve discrete sampling of said input signal.

3. The integrated circuit of claim 1, said supercharging means providing a supplemental charging signal the magnitude of which continually increases, over a predetermined signal band, as the differential between said compared signals increases beyond said threshold level.

4. The integrated circuit of claim 3, said supercharging means providing a supplemental charging signal the magnitude of which is substantially linearly related, over a predetermined signal band, to the signal differential in excess of said threshold level.

5. The integrated circuit of claim 1, said supercharging means providing a supplemental charging signal characterized by an essentially zero magnitude when the differential between said input and output signal levels is less than said threshold level, a progressively increasing magnitude as said differential progressively exceeds said threshold level, and a substantially constant magnitude when said signal differential exceeds a predetermined terminal level.

6. The integrated circuit of claim 5, said supercharging means providing a supplemental charging signal the magnitude of which is substantially linearly related, during the progressively increasing portion of said supplemental charging signal, to the signal differential in excess of said threshold level.

7. The integrated circuit of claim 6, and further including at least one additional supercharging means discrete from said circuit means, each of said additional supercharging means being connected to provide an additional charging signal to said output terminal means, each of said additional charging signals being characterized by an essentially zero magnitude when the differential between said input and output terminal signal levels is less than a predetermined threshold level for said charging signal, and a progressively increasing magnitude over a predetermined input signal band as said signal differential progressively exceeds said threshold level, the threshold level of each successive supercharging means being greater than the threshold levels of the preceding supercharging means.

8. The integrated circuit of claim 7, each of said additional charging signals being characterized by a substantially constant magnitude when said signal differential exceeds a predetermined terminal level.

9. The integrated circuit of claim 8, wherein the threshold level of each successive supercharging means is at least as great as the terminal level of the preceding supercharging means.

10. The integrated circuit of claim 1, and further including at least one additional supercharging means discrete from said circuit means, each of said additional supercharging means being connected to provide a charging signal to said output terminal means when the differential between said compared input and output signals exceeds a threshold level for said supercharging means, the threshold level of each successive supercharging means being greater than the threshold level of the preceding supercharging means.

11. The invention of claim 1, further said sample holding means comprising including a capacitor means connected to the output terminal means of said integrated circuit, said capacitor means receiving said first and supplemental charging signals and being charged thereby to successive levels representative of successive input signal samples, said capacitor means holding each successive charging level during substantially the entire interval between successive samples.

12. A sample and charging integrated circuit for sampling an input signal in response to a control signal, and concurrently charging a sample holding means to a level indicative of each successive sample, said circuit comprising:
 input terminal means for said input signal and output terminal means for connecting with a sample holding means,
 a circuit means connected between said input and output terminals for providing a first charging signal to said output terminal, the magnitude and polarity of said charging signal being determined by the input signal sample, and
 a supercharging means discrete from said circuit means, said supercharging means having means to sense first and second voltage signals at said input and output terminals, respectively, and means to provide a supplemental charging signal to add to the first charging signal at said output terminal when the difference between said sensed signals exceeds a predetermined threshold level, said supercharging means comprising:
 differential stage means having first and second branches connected to divide an input current with a portion of said current going to each branch, each of said branches having a gating means adapted to receive a gating signal, the proportion of the input current going to each branch being determined by the differential between the magnitudes of the gating signals applied to each gating means, and first and second output terminals associated respectively with said first and second branches,
 a first current source means connected to provide an input current to said differential stage means,
 means for providing first and second gating signals respectively to said first and second branch gating means, the differential between the magnitudes of said first and second gating signals being determined respectively by the differential between said first and second sensed voltages,
 a second, current-gated current source means for producing a desired supplemental charging current signal, said second current source means having an actuating means connected to said branch output terminals to receive actuating currents from said branches, the current output of said second current source means being determined by the actuating currents received from each of said branches, and
 first and second constant current drain means connected respectively to said first and second branch output terminals to drain substantially constant amounts of actuating current away from the actuating means of said second current source means,
 the relationship governing the division of current between said branches relative to the differential between their respective gating signals, the relationship governing the differential between the first and second branch gating signals relative to the differential between said first and second sensed voltages, and the operating levels of said current drain means all being selected to produce a supplemental charging current output from said second current source means characterized by a substantially zero magnitude when the differential between said first and second sensed voltages is less than a predetermined threshold level, and a progressively increasing magnitude within a predetermined range as said voltage level progressively exceeds said threshold level.

13. The integrated circuit of claim 12, wherein each of said differential stage branches includes a series connected resistor having a resistance value such that the division of input current among said branches is substantially linearly related to the relative magnitudes of their respective gating signals.

14. The integrated circuit of claim 12, said differential stage being adapted to divide current substantially equally between its branches when the gating signals applied to said branches indicate a zero differential between said sensed voltages.

15. The integrated circuit of claim 14, wherein the operating levels of said current drain means are substantially equal to each other and greater than the current passed through either of said branches when the differential between said sensed voltages is less than said threshold level, whereby said current drain means divert actuating current from said second current source means to inhibit actuation thereof until the differential between the sensed voltages exceeds said threshold level.

16. The integrated circuit of claim 12, said integrated circuit including a substrate and an epitaxial region formed on said substrate, said circuit means and supercharging means being formed on said substrate and including said epitaxial region, one of said current source means including a transistor having a collector which comprises a portion of said epitaxial region and forms a relatively large junction area with said substrate, said collector being connected in circuit with said output terminal means, and further including a circuit for inhibiting the flow of reverse bias leakage current from a sample holding means across said collector-substrate junction, said inhibiting circuit comprising:
 a first transistor means connected in series between said output terminal means and the collector of said transistor, said first transistor means having a relatively small area emitter connected to said output terminal means and a collector connected to the collector of said transistor,
 a second transistor means having a relatively small area emitter connected to said output terminal means, and means for establishing reverse bias currents of substantially equal magnitudes through said first and second transistor means, thereby substantially decoupling said transistor from a reverse bias leakage circuit with said output terminal means.

17. A sample and charging integrated circuit for sampling an input signal in response to a control signal, and concurrently charging a sample holding means to a level indicative of each successive sample, said circuit comprising:

input terminal means for said input signal and output terminal means for connecting with a sample holding means, a circuit means connected between said input and output terminals for providing a first charging signal to said output terminal, the magnitude and polarity of said charging signal being determined by the input signal sample, and a supercharging means having means to sense first and second voltage signals at said input and output terminals, respectively, and means to provide a supplemental charging signal to said output terminal when the difference between said sensed signals exceeds a predetermined threshold level, said supercharging means comprising:

differential stage means having first and second branches connected to divide an input current with a portion of said current going to each branch, each of said branches having a gating means adapted to receive a gating signal, the proportion of the input current going to each branch being determined by the differential between the magnitudes of the gating signals applied to each gating means, and first and second output terminals associated respectively with said first and second branches, a first current source means connected to provide an input current to said differential stage means, means for providing first and second gating signals respectively to said first and second branch gating means, the differential between the magnitudes of said first and second gating signals being determined respectively by the differential between said first and second sensed voltages, a second, current-gated current source means for producing a desired supplemental charging current signal, said second current source means having an actuating means connected to said branch output terminals to receive actuating currents from said branches, the current output of said second current source means being determined by the actuating currents received from each of said branches, said second current source means comprising first and second current drivers adapted to be actuated by actuating currents from said first and second branches respectively, and each said driver being connected to an output terminal of said integrated circuit, one of said drivers being adapted to deliver current to and the other driver being adapted to draw current from said output terminal and first and second constant current drain means connected respectively to said first and second branch output terminals to drain substantially constant amounts of actuating current away from the actuating means of said second current source means, the relationship governing the division of current between said branches relative to the differential between their respective gating signals, the relationship governing the differential between the first and second branch gating signals relative to the differential between said first and second sensed voltages, and the operating levels of said current drain means all being selected to produce a supplemental charging current output from said second current source characterized by a substantially zero magnitude when the differential between said first and second sensed voltages is less than a predetermined threshold level, and a progressively increasing magnitude within a predetermined range as said voltage level progressively exceeds said threshold level.

18. The integrated circuit of claim 17, wherein said first current source, said differential stage, and said current drains are arranged such that actuating current is provided to one of said current drivers for a positive differential between said voltages and to the other current driver for a negative differential.

19. The integrated circuit of claim 18, wherein the operating current levels of each current drain means is selected such that the current drained thereby is substantially equal to the current passed through its associated branch when the differential between said sensed voltages equals said threshold level and its associated branch is carrying the majority of current passing through the differential stage means.

20. The integrated circuit of claim 19, said differential stage, current drivers and current drains being selected such that said current drivers produce substantially symmetrical output current waveforms of opposite polarities.

* * * * *